United States Patent
Bergbauer et al.

(10) Patent No.: US 10,312,401 B2
(45) Date of Patent: Jun. 4, 2019

(54) METHOD FOR PRODUCING AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventors: Werner Bergbauer, Windberg (DE); Thomas Lehnhardt, Regensburg (DE); Jürgen Off, Regensburg (DE); Joachim Hertkorn, Wörth an der Donau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/115,242

(22) PCT Filed: Feb. 13, 2015

(86) PCT No.: PCT/EP2015/053051
§ 371 (c)(1),
(2) Date: Jul. 28, 2016

(87) PCT Pub. No.: WO2015/121399
PCT Pub. Date: Aug. 20, 2015

(65) Prior Publication Data
US 2017/0005223 A1    Jan. 5, 2017

(30) Foreign Application Priority Data
Feb. 17, 2014   (DE) .................. 10 2014 101 966

(51) Int. Cl.
*H01L 31/18*    (2006.01)
*H01L 21/02*    (2006.01)
(Continued)

(52) U.S. Cl.
CPC ...... *H01L 31/1852* (2013.01); *H01L 21/0243* (2013.01); *H01L 21/0254* (2013.01);
(Continued)

(58) Field of Classification Search
CPC ........... H01L 21/0254; H01L 21/02639; H01L 31/036; H01L 21/0243; H01L 31/1852
See application file for complete search history.

(56) References Cited

U.S. PATENT DOCUMENTS 7,638,414 B2    12/2009   Choi et al.
2003/0176001 A1    9/2003   Fukuyama et al.
(Continued)

FOREIGN PATENT DOCUMENTS

DE    102008010318 A1    9/2008
DE    102011114671 A1    4/2013
(Continued)

OTHER PUBLICATIONS

Lai et al, GaN-Based Ultraviolet Light Emitting Diodes With Ex Situ Sputtered AlN Nucleation Layer, Nov. 2013, Journal of Display Technology, vol. 9, No. 11, pp. 895-899.*
(Continued)

*Primary Examiner* — Marc Anthony Armand
(74) *Attorney, Agent, or Firm* — Slater Matsil, LLP

(57) ABSTRACT

A method for producing an electronic semiconductor chip and a semiconductor chip are disclosed. In embodiments, the method includes providing a growth substrate having a growth surface formed by a flat region having a plurality of three-dimensional surface structures on the flat region, directly applying a nucleation layer of oxygen-containing AlN over a large area to the growth surface and growing a nitride-based semiconductor layer sequence on the nucleation layer, wherein growing the semiconductor layer
(Continued)

sequence includes selectively growing the semiconductor layer sequence upwards from the flat region.

14 Claims, 4 Drawing Sheets

(51) Int. Cl.
H01L 33/12 (2010.01)
H01L 33/22 (2010.01)
H01L 33/00 (2010.01)
H01L 31/0304 (2006.01)
H01L 33/32 (2010.01)

(52) U.S. Cl.
CPC .. *H01L 21/02458* (2013.01); *H01L 21/02639* (2013.01); *H01L 21/02647* (2013.01); *H01L 31/03044* (2013.01); *H01L 31/1856* (2013.01); *H01L 33/007* (2013.01); *H01L 33/0066* (2013.01); *H01L 33/0075* (2013.01); *H01L 33/12* (2013.01); *H01L 33/22* (2013.01); *H01L 33/32* (2013.01); *H01L 21/02488* (2013.01); *H01L 2933/0033* (2013.01)

(56) References Cited

U.S. PATENT DOCUMENTS

| | | | |
|---|---|---|---|
| 2004/0183078 A1* | 9/2004 | Wang | H01L 21/0237 257/74 |
| 2007/0206130 A1 | 9/2007 | Wuu et al. | |
| 2010/0219445 A1 | 9/2010 | Yokoyama et al. | |
| 2011/0012109 A1 | 1/2011 | Kryliouk et al. | |
| 2011/0150017 A1 | 6/2011 | Chua et al. | |
| 2012/0273821 A1 | 11/2012 | Wei et al. | |
| 2012/0305888 A1 | 12/2012 | Lee | |
| 2013/0277684 A1* | 10/2013 | Araki | H01L 21/0243 257/76 |
| 2013/0320353 A1* | 12/2013 | Kryiouk | H01L 21/0237 257/76 |
| 2014/0124010 A1* | 5/2014 | Vaudo | H01L 35/32 136/200 |
| 2014/0346541 A1 | 11/2014 | Hertkorn et al. | |
| 2015/0076507 A1 | 3/2015 | Hertkorn et al. | |
| 2015/0171263 A1 | 6/2015 | Nakatsu et al. | |

FOREIGN PATENT DOCUMENTS

| | | |
|---|---|---|
| DE | 102012103686 A1 | 10/2013 |
| JP | WO2013187171 A1 | 2/2016 |
| JP | WO2014021259 A1 | 7/2016 |
| WO | 2004105108 A2 | 12/2004 |
| WO | 2009041256 A1 | 4/2009 |
| WO | 2012036522 A2 | 3/2012 |

OTHER PUBLICATIONS

Blasing et al., Oxygen induced strain field homogenization in AlN nucleation layers and its impact on GaN grown by metal organic vapor phase epitaxy on sapphire: An x-ray diffraction study, 2009, Journal of Applied Physics, vol. 105, pp. 033504-1 through 033504-9.*

Kuhn et al., An Oxygen Doped Nucleation Layer for the Growth of High Optical Quality GaN on Sapphire, Aug. 4, 2001, phys. stat. sol., No. 2, pp. 629-633.*

Van Zant, Microchip Fabrication, 2000, McGraw-Hill, Fourth Edition, pp. 378-379 and pp. 411-412.*

Bläsing, J. et al., "Oxygen induced strain field homogenization in AlN nucleation layers and its impact on GaN grown by metal organic vapor phase epitaxy on sapphire: An x-ray diffraction study," Journal of Applied Physics, vol. 105, No. 3, Feb. 3, 2009, pp. 033504-1-033504-9.

Hertkorn, J. et al., "Optimization of nucleation and buffer layer growth for improved GaN quality," Journal of Crystal Grown 308, Aug. 8, 2007, pp. 30-36.

* cited by examiner

METHOD FOR PRODUCING AN OPTOELECTRONIC SEMICONDUCTOR CHIP AND OPTOELECTRONIC SEMICONDUCTOR CHIP

This patent application is a national phase filing under section 371 of PCT/EP2015/053051, filed Feb. 13, 2015, which claims the priority of the German patent application 10 2014 101 966.0, filed Feb. 17, 2014, each of which is incorporated herein by reference in its entirety.

TECHNICAL FIELD

A method for producing an electronic semiconductor chip and an electronic semiconductor chip are provided.

SUMMARY OF THE INVENTION

Embodiments of the invention provide a method for efficiently producing an electronic semiconductor chip. Further embodiments provide an electronic semiconductor chip.

Pursuant to at least one embodiment of a method for producing an electronic semiconductor chip, a growth substrate is provided. Said growth substrate comprises a growth surface onto which semiconductor layers are applied in the following steps. The growth surface is formed by a flat region on which a plurality of three-dimensional surface structures is designed. In other words, the growth surface comprises a two dimensionally designed area, formed by the flat region, and three-dimensionally designed areas, formed by the surface structures, which project from the plane formed by the flat region and/or project from the latter into the growth substrate. The three-dimensional surface structures on the flat region of the growth surface also allow the substrate to be designated as pre-structured substrate.

For example, the surface structures can be formed by elevations extending away from the flat region. Such elevations can more preferably be conical, thus having a round cross-section when the growth surface is viewed from above, or pyramidal, thus having a polygonal cross-section when the growth surface is viewed from above, for example, a triangular, quadrangular, hexagonal or another polygonal cross-section.

Furthermore, the surface structures can also be formed by grooves projecting into the growth substrate. Such grooves can, for example, be conical or pyramidal grooves, thus having a round cross-section or a polygonal cross-section when the growth surface is viewed from above, for example a triangular, quadrangular, hexagonal or another polygonal cross-section in the latter case.

Pursuant to a further embodiment, a nucleation layer is applied to the growth surface in a further step. Said nucleation layer is in particular intended to provide crystal surfaces onto which further layers, in particular semiconductor layers, for example consisting of a nitride compound semiconductor material of a high crystal quality, can be applied. The nucleation layer thus provides surfaces on which a first layer of the semiconductor layer sequence can grow.

More preferably the nucleation layer is applied large-scale to the growth surface, meaning that the nucleation layer is not applied selectively but instead onto both the flat region and the three-dimensionally designed surface structures of the growth surface. The nucleation layer can also be formed by a plurality of posts arranged next to each other, which are applied large-scale to the growth surface. "Large-scale" thus does not necessarily mean "all-over" in terms of the present application. A large-scale application is also achieved in terms of the present application when sections of the growth surface are not covered by the nucleation layer, as long as at least sections of the flat region as well as sections of the surface structures are covered by the nucleation layer.

The nucleation layer can be applied in such a way that, where possible, the entire growth surface, i.e. where possible, the entire flat region and the surface structures, are covered by the nucleation layer. This can, for example, ensue by way of a random-directional application process or by way of an application along a main direction that is perpendicular or substantially perpendicular to the flat region. Furthermore, it also possible to select a direction of application oriented obliquely to the flat region. Depending on the design of the surface structures and the direction of application, this allows a partial shading of the flat region and/or the surface structures to be achieved, and therefore the nucleation layer may be applied to the flat region and the surface structures, but only to a section of the flat region and/or only to a section of the surface structures. Even in the event of an application with shaded areas, the selectivity during growth of the semiconductor layer sequence described further below can still be achieved.

Pursuant to a further embodiment, a semiconductor layer sequence is grown on the nucleation layer in a further step. Said semiconductor layer sequence comprises at least one semiconductor layer and preferably a plurality of semiconductor layers. The semiconductor layer sequence can in particular be grown by means of an epitaxy method, such as MOVPE (metal-organic vapor-phase epitaxy) or MBE (molecular beam epitaxy), and therefore the growth substrate together with the nucleation layer thus form a so-called quasi substrate for the subsequent epitaxy. Furthermore, HVPE (hydride vapor phase epitaxy), LPE (liquid phase epitaxy) or sputtering or combinations of the stated application processes for applying the semiconductor layer sequence are also possible.

The semiconductor layer sequence can in particular be a nitride-based semiconductor layer sequence. The designation "nitride-based" includes in particular semiconductor layers and semiconductor layer sequences comprising a material from the III-V compound semiconductor material system $In_xAl_yGa_{1-x-y}N$ with $0 \leq x \leq 1$, $0 \leq y \leq 1$ and $x+y \leq 1$, thus for example GaN, AlN, AlGaN, InGaN, AlInGaN. The semiconductor layer sequence can comprise dopants as well as additional components. For the sake of simplicity, however, only the essential components of the crystal lattice, i.e. Al, Ga, In as well as N are stated, even if the latter can be partially replaced and/or substituted by small quantities of further substances.

Pursuant to a further embodiment, the nucleation layer is formed by oxygen-containing aluminum nitride, hereinafter also designated as AlN:O or AlON. The latter designations include compositions of the nucleation layer in which the oxygen can be present as dopant or even in the percent range in the nucleation layer. The oxygen content in the nucleation layer allows a special defect structure in the semiconductor layer sequence to be achieved, which enables an efficient reduction in the defect density or in an active layer of the semiconductor layer sequence. The tensioning of the subsequently applied layers, i.e. of the semiconductor layer sequence, can also be influenced. The oxygen can also influence the degree of relaxation of the nucleation layer, which can substantially influence the curvature behavior of the subsequently applied layers. In particular, oxygen-containing AlN can also influence the selectivity with regard to the surface areas of the growth surface on which the semiconductor layer applied to the nucleation layer grows.

It has in particular been found that an epitaxial growth of pre-structured substrates during the growth of the semiconductor layer sequence on the nucleation layer requires a strong selectivity between the two-dimensional flat region and the three-dimensionally designed surface structures arranged thereupon, in particular the facets of the surface structures designed as elevations or grooves, in order to produce a semiconductor layer sequence of sufficient quality. In other words, specific surface areas of the growth surface need to be selected on which a growth of a semiconductor layer on the nucleation layer ensues, while no or only little growth preferably ensues on other surface areas. In particular, a targeted selection needs to be made between the flat region and surfaces of the three-dimensionally designed surface structures as possible growth surfaces for an epitaxially applied semiconductor material. If such a selectivity is non-existent, the result is a poor material quality and a yield weakening, in particular in the event of a semiconductor chip designed as a light-emitting diode with regard to the low current behavior and the block voltage as well as with respect to a poorer performance, such as a lower light output, for instance. Furthermore, in the event of semiconductor chip designed as a light-emitting diode, the light output from the semiconductor chip benefiting from the surface structures on the growth surface can be negatively influenced by the non-existent selectivity. The amount of emitted light can also be reduced by absorption in parasitic, crystalline very poor GaN areas.

In order to achieve as good a selectivity as possible in pre-structured substrates between the three-dimensional surface structures and the smooth surface areas located therebetween of the flat region of the growth surface, attempts were made in the past to adjust special process conditions during nucleation, for example an increased pressure and a very low ratio of the group V elements to the group III elements in the event of a GaN nucleation. Despite such measures, a significant epitaxy for the further epitaxy nevertheless took place on the three-dimensional structures in prior art. In addition, the process windows are generally severely constrained and require constant time-consuming control.

The nucleation layer consisting of oxygen-containing aluminum nitride allows the semiconductor layer sequence to be selectively grown from the flat region of the growth surface, meaning that the growth of the semiconductor layer sequence or of a first layer or of a first layer area of the latter ensues selectively on the flat region, i.e. that a formation of the semiconductor layer sequence begins selectively on the flat region. This can in particular mean that a large proportion of the growth of the semiconductor layer sequence ensues from the flat region and a small proportion thereof from the surfaces of the three-dimensionally designed surface structures. The semiconductor layer sequence in an epitaxial variant preferably grows only substantially from the flat region, whereas very little or even no growth at all of the semiconductor layer sequence takes place on the surface structures. This ensures that the three-dimensionally designed surface structures are not overgrown by the semiconductor layer sequence, i.e. the latter does not grow directly on said surface structures and, instead, the three-dimensionally designed surface structures are substantially covered by the semiconductor layer sequence, said semiconductor layer sequence thus covering the surface structures by the growth from the flat region. "Substantially" in this context means that no growth of the semiconductor layer sequence or only a small proportion thereof ever takes place on the surface structures.

Pursuant to a further embodiment, the selectivity of the growth of the semiconductor layer sequence on the flat region is preferably targetedly adjusted by means of the oxygen content of the nucleation layer. Whereas, in the event of an oxygen-free AlN nucleation layer, the growth of the semiconductor layer sequence on the surfaces of the three-dimensionally designed surface structure has been found to be dominant compared with the growth on the flat region, increasing the oxygen content of the nucleation layer can achieve the previously described advantageous selectivity. AlN with an oxygen content of less than $10^{19}$ cm$^{-3}$ can be designated as oxygen-free AlN herein.

Pursuant to a further embodiment, the application of the nucleation layer ensues by means of metal-organic vapor-phase epitaxy. The selection of suitable starting materials, also designated as precursors, and the gaseous flux thereof allows the nucleation layer to be produced with any desired oxygen content. $O_2$, $H_2O$, nitric oxide or any oxygen-containing metal-organic compound can be used as a source of oxygen. A gas source based on $N_2$ and/or $H_2$, mixed with $O_2$ and/or nitric oxides can be used, for example. $H_2O$ to which a carrier gas is added via a bubbler can also be used. Another possibility, for example, is that a metal-organic gas source containing oxygen is used, for example diethylaluminum ethoxide or a mixture of diethylaluminum ethoxide and trimethylaluminum. The control of the amount of oxygen-containing gases added during the growth process of the nucleation layer allows the oxygen concentration of the nucleation layer to be controlled and targetely adjusted.

Furthermore, another possibility is to terminate the growth surface with oxygen. For example, the growth substrate can be pre-conditioned in $O_2$ plasma to this end. Such an oxygen termination of the growth surface leads to the growth of oxygen-containing AlN with gas sources as well, which are usually used for producing oxygen-free AlN nucleation layers. In particular, an aluminum oxide growth substrate can be preconditioned by an $O_2$ plasma, as the oxygen termination of the aluminum surface can lead to growth of oxygen-containing AlN specifically on the aluminum oxide-aluminum nitride limiting surface.

The previously described sources or methods for providing the oxygen can also be combined with each other, for example a surface conditioning with oxygen and the addition of an oxygen-containing gas.

Pursuant to a further embodiment, the application of the nucleation layer ensues by means of sputtering. To this end, for example, an Al target can be used in a nitrogen atmosphere, to which oxygen is added. In contrast to metal-organic vapor-phase epitaxy, sputtering also allows thick layers to be generated comparatively cost-effectively and with relatively high growth rates. The generation of the nucleation layer by means of sputtering also allows the subsequent epitaxial process for growing the semiconductor layer sequence to be shortened and/or simplified. Furthermore, the sputtering of the nucleation layer allows the presence of aluminum to be reduced in a subsequent MOVPE process for generating the semiconductor layer sequence.

Furthermore, other methods for applying the nucleation layer are also possible, for example MBE, CVD (chemical vapor deposition) or a suitable physical method.

Pursuant to a further embodiment, the amount of oxygen in the nucleation layer is controlled in such a way that the oxygen content in the nucleation layer equals more than $10^{19}$ cm$^{-3}$. In particular, the weight proportion of the oxygen on the nucleation layer can preferably be greater than or equal to 0.01%, greater than or equal to 0.1%, greater than or equal to 0.2% or greater or equal to 0.5%. Furthermore, the weight proportion of the oxygen on the nucleation layer can preferably be less than or equal to 10%, less than or equal to 5% or less than or equal to 1.5%.

Furthermore, another possibility is to apply a layer of oxygen-free AlN with one of the aforementioned methods, subsequently oxide it in an oxidation oven and thus convert it into an oxygen-containing AlN layer.

Pursuant to a further embodiment, the nucleation layer is applied to the growth surface with a thickness of greater than or equal to 1 nm, greater than or equal to 5 nm, greater than or equal to 10 nm, greater than or equal to 30 nm or greater than or equal to 50 nm. Alternatively or additionally, the thickness of the nucleation layer can be less than or equal to 1000 nm, less than or equal to 200 nm or less than or equal to 150 nm. For example, the thickness of the nucleation layer can be approximately 100 nm.

Pursuant to a further embodiment, the growth substrate comprises or consists of aluminum oxide $Al_2O_3$. In particular, as flat region of the growth surface in such case, the growth substrate can comprise a crystallographic c surface with 0001 orientation or (−c) surface with 000-1 orientation of the aluminum oxide. In particular, it has been found that an oxygen-containing AlN nucleation layer allows the growth of the semiconductor layer sequence on the aluminum oxide c surface or aluminum oxide (−c) surface to be selectively selected, whereas no or only little growth of the semiconductor layer sequence on the nucleation layer ensues on the crystal surfaces providing the three-dimensionally designed surface structures and in such case being different to the c surface or (−c) surface and containing a multiplicity of crystal surfaces.

Furthermore, another possibility is that the flat region is formed by an r surface of aluminum oxide, which is particularly suitable for growing semipolar gallium nitride.

Furthermore, the growth substrate can also comprise a silicon-containing growth surface. In particular, the growth surface can be formed by a silicon surface or a silicon carbide surface. To this end, the growth substrate can, for example, be a silicon substrate or a SiC substrate or comprise a silicon or SiC layer on another substrate. In addition, the growth substrate can also comprise or consist of one of the following materials: LiGaO, LiAlO, ZnO, quartz glass, mica.

Pursuant to at least one embodiment, a semiconductor layer sequence is grown via the nucleation layer with an optoelectronic active layer. Said optoelectronic active layer of the semiconductor layer sequence can be set up and provided during operation of the semiconductor chip for emitting and/or for detecting light, in particular in the ultraviolet or in the visible spectral range. In particular, a wavelength of the generated or detectable light can equal between 380 nm and 680 nm inclusively. The optoelectronic active layer can preferably comprise one or more pn transitions or one or more quantum well structures. The semiconductor chip can thus be designed as light-emitting diode or as light-detecting diode.

The semiconductor layer sequence can also comprise at least one or more n doped layers and at least one or more p doped layers, wherein each of these doped semiconductor layers can preferably be directly adjacent to the optoelectronic active layer. In addition, the semiconductor layer sequence can, for example, also comprise undoped layers, such as a buffer layer, for instance. The latter can, for example, be directly grown on the nucleation layer and have a thickness, which is greater than the height of the three-dimensionally designed surface structures, and therefore the surface structures can be covered by means of the buffer layer.

Pursuant to a further embodiment, an electronic semiconductor layer comprises a growth substrate with a growth layer, which is formed by a flat region with a plurality of three-dimensionally designed surface structures on the flat region. Furthermore, the semiconductor chip can comprise a nucleation layer composed of AlN:O directly applied large-scale to the growth surface and a nitride-based semiconductor layer sequence on the nucleation layers, wherein the semiconductor layer sequence is selectively grown from the flat region.

The embodiments and features described in conjunction with the method for producing the electronic semiconductor chip apply equally to the semiconductor chip and vice versa.

BRIEF DESCRIPTION OF THE DRAWINGS

Further advantages, advantageous embodiments and developments result from the embodiments described below in conjunction with the illustrations.

Shown in.

Identical, similar or seemingly identical elements in the embodiments and illustrations can always be furnished with the same reference signs. The elements shown and the size ratios amongst each other should not be viewed as true-to-scale; instead individual elements, such as layers, components, structural units and areas, can be shown exaggeratedly large for the sake of better representation and/or better understanding.

DETAILED DESCRIPTION OF ILLUSTRATIVE EMBODIMENTS

FIG. 1A to 5 shows steps in a method for producing an electronic semiconductor chip 100. Said electronic semiconductor chip 100 is purely exemplarily designed as a light-emitting diode with an optoelectronic active layer, which is set up for generating and emitting light during operation. As an alternative to a light-emitting diode, the electronic semiconductor chip 100 can, for example, also be designed as a light-detecting diode or as another semiconductor element, for example as transistor, or comprise such an element.

Figure 1A:
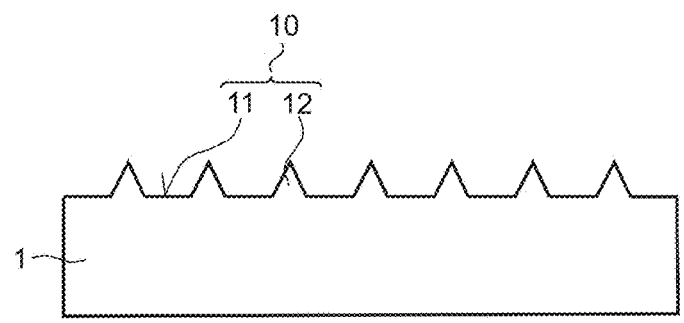
FIG. 1a to 5 are schematic diagrams of steps in a method for producing an electronic semiconductor chip.

In a first step a growth substrate 1 is provided that, as shown in FIG. 1A, comprises a growth surface 10. Said growth surface 10 is provided for the purpose of growing a semiconductor layer sequence on this one semiconductor layer sequence. The growth substrate 1 in the embodiment shown comprises aluminum oxide ($Al_2O_3$) and is preferably composed of aluminum oxide. In particular, the growth substrate 1 can be designed as aluminum oxide wafer, on which a semiconductor layer sequence is grown large-scale. The separation of the wafer with the grown semiconductor layer sequence allows a plurality of semiconductor chips to be produced.

The growth surface 10 comprises a two-dimensionally designed flat region 11, on which a plurality of three-dimensionally designed surface structures 12 is arranged. In other words, the surface structures 12 project out of the plane formed by the flat region 11. The three-dimensionally designed surface structures 12 are designed as elevations, which extend upwards away from the flat region 11.

Figure 1B:
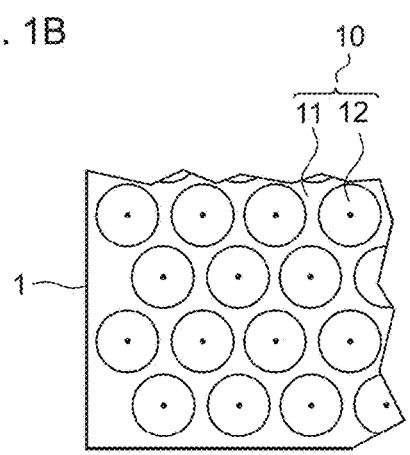
Figure 1C:
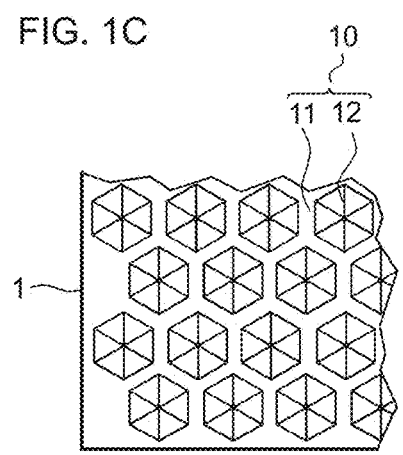

FIGS. 1B and 1C show views of the growth surface 10 from growth substrates 1, in which the cross-section of the surface structures 12 is recognizable. As shown in FIG. 1B, the cross-section of the surface structures 12 can be round and in particular circular, and therefore the surface structures 12 can be designed as conical elevations. Alternatively, the surface structures 12 can also comprise an angular, for example a hexagonal cross-section, as shown in FIG. 1C, and therefore the surface structures 12 can also be designed as pyramidal elevations on the flat region 11, said flat region 11 extends between the surface structures 12 designed as elevations.

The flat region 11 is more preferably formed by a crystallographic c surface or (−c) surface of the aluminum oxide, which is particularly suitable for growing nitride-based semiconductor materials. Accordingly, the surfaces of the surface structures 12 are formed by a plurality of other crystal surfaces in compliance with their orientation relative to the flat region 11.

Alternatively to the embodiment shown, the growth substrate 1 can, for example, also comprise a growth surface 10 formed by silicon or silicon carbide and be correspondingly designed, for example, as silicon wafer or silicon carbide wafer. Furthermore, another possibility is that the growth substrate comprises or consists of another material stated above in the general section above.

Figure 1D:
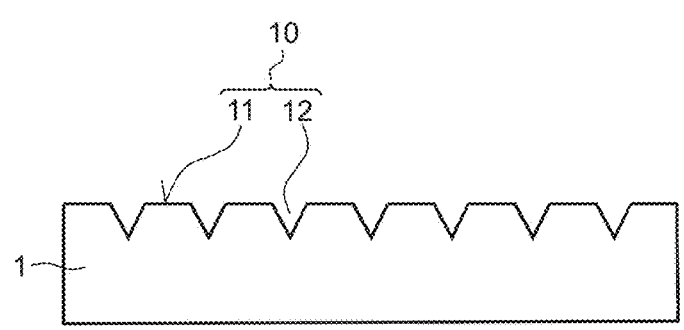

FIG. 1D shows an alternative embodiment for the growth substrate 1, in which the surface structures 12 are designed in contrast to the embodiment in FIG. 1a as grooves projecting from the flat region 11 into the growth substrate 1. Similarly to the previously described elevations, the grooves can, for example, be conical or pyramidal. The following description of the further steps refers purely exemplarily to the embodiment of the growth substrate 1 pursuant to FIG. 1 with elevations as surface structures, but the growth substrate in the steps described in the following can also be provided with grooves as surface structures 12.

Figure 2:
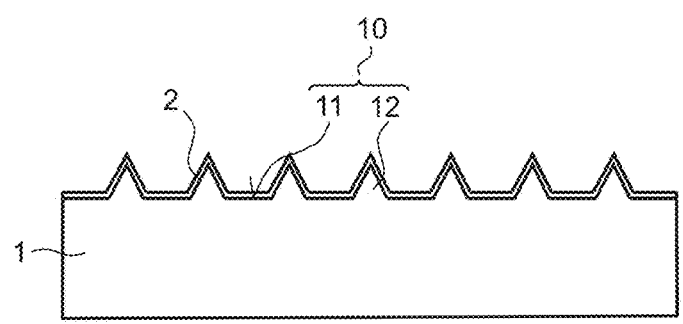

In a further step, as shown in FIG. 2, a nucleation layer 2 is applied to the growth surface 10. In particular, said nucleation layer 2 is applied large-scale, i.e. on the flat region 11 as well as on the three-dimensionally designed surface structures 12 of the growth surface 10. The nucleation layer 2 consists of oxygen-containing aluminum nitride, i.e. AlN:O or AlON, which is applied directly to the growth surface 10.

For example, a metal-organic vapor-phase epitaxy (MOVPE) can be used to this end, in which an oxygen-containing starting material is used in addition to suitable starting materials for providing Al and N, as described in the general section. Alternatively or additionally, as described in the general section, an oxygen termination of the growth surface 10 can be implemented.

As an alternative to an MOVPE method, the nucleation layer 2 can also be applied by means of a sputtering method. As described in the general section, an Al target in a nitrogen atmosphere that also additionally contains oxygen can, for example, be used to this end. Furthermore, another method described in the general section above is also possible.

The amount of oxygen in the nucleation layer 2 is controlled in such a way that the oxygen content in the nucleation layer 2 equals more than $10^{19}$ cm$^{-3}$. In particular, the weight proportion of the oxygen on the nucleation layer 2 can preferably be greater than or equal to 0.01%, greater than or equal to 0.1%, greater than or equal to 0.2% or greater or equal to 0.5%. Furthermore, the weight proportion of the oxygen on the nucleation layer can preferably be less than or equal to 10%, less than or equal to 5% or less than or equal to 1.5%.

The thickness of the nucleation layer 2 is greater than or equal to 1 nm, greater than or equal to 5 nm, greater than or equal to 10 nm, greater than or equal to 30 nm or greater than or equal to 50 nm. Furthermore, the nucleation layer 2 can be produced with a thickness of less than or equal to 1000 nm, less than or equal to 200 nm or less than or equal to 150 nm. For example, the thickness of the nucleation layer can be approximately 100 nm.

Figure 3:
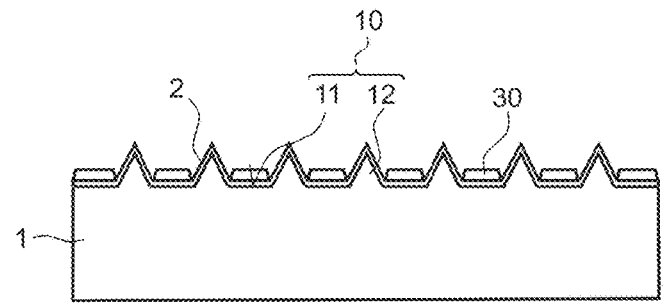
Figure 4:
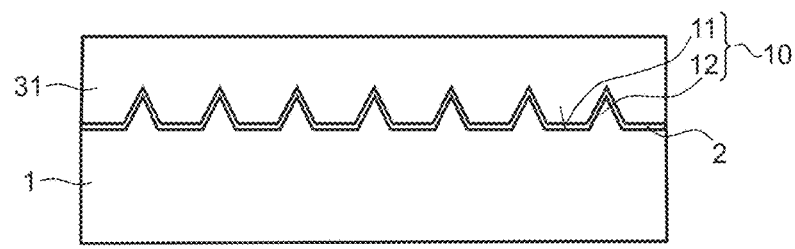
Figure 5:
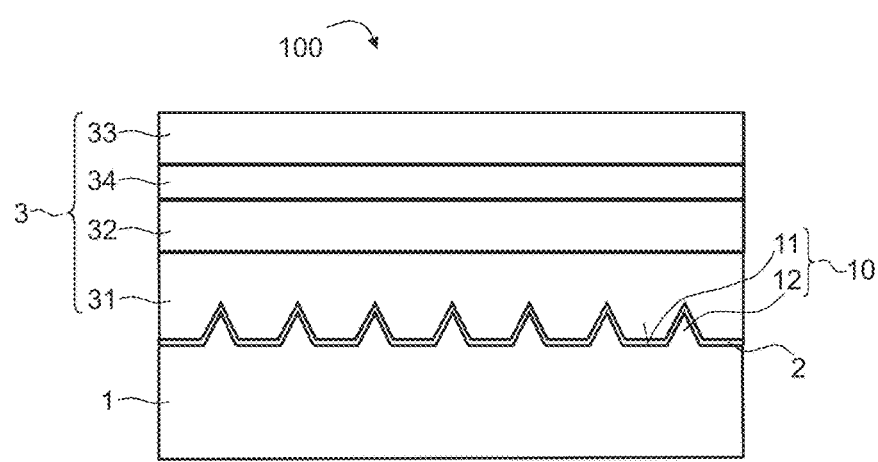

In a further step described in conjunction with FIG. 3 to 5, a nitride-based semiconductor layer sequence is grown on the nucleation layer by means of MOVPE.

As shown in FIG. 3, the growth of the semiconductor layer ensues selectively from the flat region 11. As described in the general section, this is possible due to the fact that the nucleation layer 2 is not composed of AlN, as is usual in prior art, but instead additionally contains oxygen. The oxygen content of the nucleation layer 2 allows the selectivity of the growth of the semiconductor layer sequence to be adjusted on the flat region 11, and therefore the semiconductor material to be grown is predominantly grown from the flat region 11 to the nucleation layer 2 due to the desired selectivity. Conversely, little or no growth occurs on the surfaces of the three-dimensionally designed surface structures 12 due to the use of the oxygen-containing AlN nucleation layer 2, as can be seen in FIG. 3 in which an initial stage of the growth process for producing the semiconductor layer sequence 3 can be seen: a semiconductor material 30, which is applied for producing a first semiconductor layer 31 of the semiconductor layer sequence 3, grows selectively upwards from the flat region 11 on the nucleation layer 2.

Figure 6A:
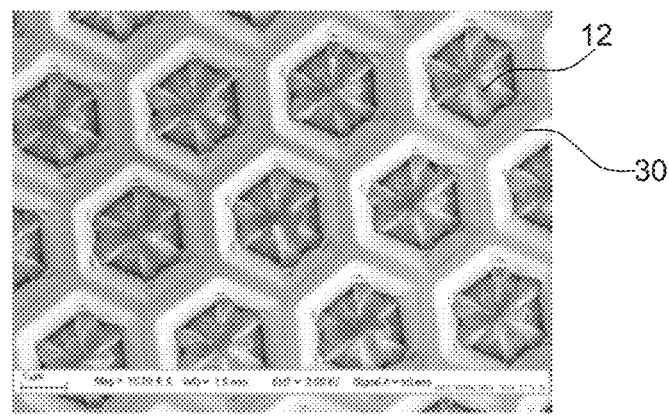
FIGS. 6a to 6c are secondary electron microscope images of the growth of GaN on nucleation layers pursuant to further embodiments and FIG. 7 are measurements of wafer bows during the semiconductor growth when using different nucleation layer compositions.
Figure 6B:
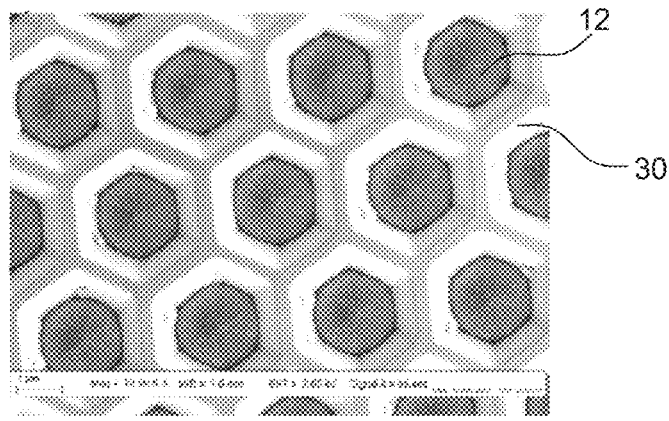

FIGS. 6A and 6B show secondary electron microscope images of a corresponding stage in the method when growing GaN on an oxygen-containing AlN nucleation layer. The images correspond to a view from above of the growth surface according to the view in FIG. 1C. In the event of the image in FIG. 6a, the nucleation layer was applied by means of MOVPE using an oxygen-containing starting material, whereas, in the event of the image in FIG. 6, the nucleation layer was sputtered on by adding oxygen. In both images it is very clearly recognizable that the surface structures 12 show only little or no growth whatsoever of the semiconductor material 30 and that the latter instead grows selectively between the surface structures 12 and thus on the flat region of the growth surface.

In comparison to this, the growth on a corresponding growth substrate when using an oxygen-free AlN nucleation layer is shown. As is easily recognizable, the growth here ensues more intensively on the surfaces of the surface structures, which are covered by the semiconductor material 30 and are thus unrecognizable in the image. As a result, the grown semiconductor material 30 forms no uniform crystal surface, but instead comprises a plurality of crystal surfaces, which leads to a poor material quality of the further grown semiconductor material or in subsequently grown semiconductor layer sequence.

Figure 6C:
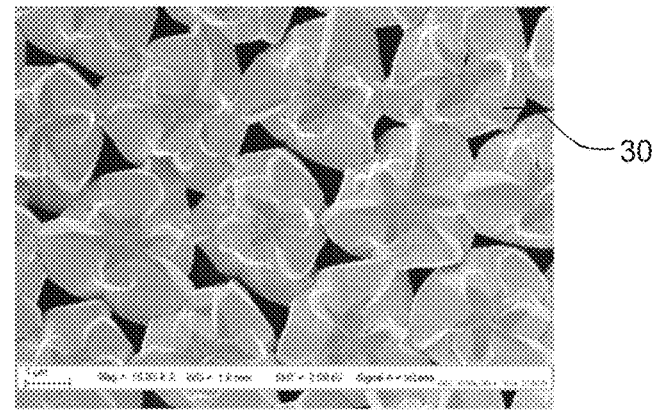

The addition of oxygen during the production of the nucleation layer 2 thus allows a strong selectivity of the subsequent growth process of the semiconductor material of the semiconductor layer sequence to be achieved both when using an MOVPE method and when using a sputtering method for producing the nucleation layer. The addition of oxygen can thus ensue both within an MOVPE method during the corresponding production of the nucleation layer 2 and outside said method during the production of the nucleation layer by means of sputtering. Conversely, alternative nucleation processes with oxygen-free AlN within MOVPE methods always lead to significant parasitic nucleations on the surface structures, as shown in FIG. 6C.

As shown in FIG. 4, the semiconductor material grown on the nucleation layer 2 can be grown so far that a semiconductor layer 31 forms, for example an undoped buffer layer, which then covers the surface structures 12. As an alternative, the semiconductor layer 31 can also comprise a plurality of layers with differing undoped and/or doped materials.

In order to form the semiconductor layer sequence 3, further semiconductor layers are then grown on the semiconductor layer 31. As shown in FIG. 5, said further semiconductor layers can, for example, be formed by doped semiconductor layers 32, 33, between which an optoelectronic active layer 34 is arranged. The semiconductor layer sequence 3 can, in particular, consist of a plurality of doped and undoped layers, which are not shown here for the sake of clarity. In particular, the structure of a semiconductor layer sequence 3 for a light-emitting or light-detecting diode is known to a person skilled in the art and is thus not further elaborated. The semiconductor chip 100 shown in FIG. 5 can additionally comprise further layers, such as electrode layers for electrically contacting the semiconductor layer sequence, mirror layers and/or passivation layers, for example, which are likewise not shown for the sake of clarity.

In the exemplary embodiment of the electronic semiconductor chip 100 as light-emitting diode, the semiconductor chip 100 can emit light in the direction of an upper side facing away from the growth substrate 1 as well as in the direction of the growth substrate 1 during operation. A decrease or reduction in total reflection can be achieved by the surface structures 12 for light emitted by the optoelectronic active layer 34 in the direction of the growth substrate 1.

The previously described method allows an improvement in the selectivity of the growth process of the semiconductor layer sequence on the nucleation layer to be achieved by the use of an oxygen-containing AlN nucleation layer on a pre-structured substrate, which can also advantageously lead to a significant expansion of the process parameters of the subsequent layers. Furthermore, the low and preferably scant or non-existent growth of the three-dimensionally designed surface structures positively influences not only the material quality in the event of light-emitting diodes but also the electroscopic parameters, such as light, leakage currents and low current behavior, for example. As no time-consuming temperature ramps and pressure slopes are necessary during the nucleation, it may be possible to perceptibly reduce the growth time in an MOVPE system.

Figure 7:
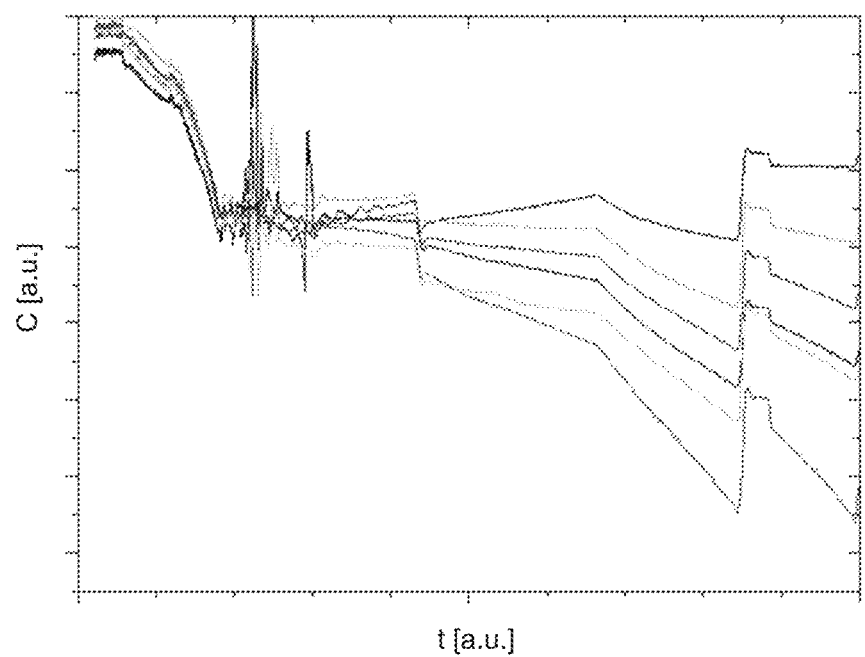

In addition, it has been found that a determination of the degree of relaxation of the deposited oxygen-containing aluminum nitride as nucleation layer and the monitoring degree of the three-dimensionally designed surface structures allows an adjustment of the curvature of the growth substrate during the growth of semiconductor layer sequence. To this end, FIG. 7 shows wafer bows C during the semiconductor growing process in accordance with the processing time t for different compositions of the nucleation layer. It has been found that the curvature of the wafers during growth can be controlled by the characteristics of the oxygen-containing AlN nucleation layer. The targeted addition and amount of oxygen can influence the degree of relaxation of the oxygen-containing AlN and, accordingly, the state of tensioning of the subsequent layers.

The embodiments shown in the illustrations can comprise further and alternative features pursuant to the description in the general section.

The description on the basis of the embodiments does not restrict the invention thereto. Instead, the invention includes every new feature as well as every combination of features, which in particular includes very combination of features in the claims, even if such feature or such claim is not itself explicitly stated in the claims or embodiments.

The invention claimed is:

1. A method for producing an electronic semiconductor chip, the method comprising:
    providing a growth substrate comprising a growth surface formed by a planar region having a plurality of three-dimensional surface structures on the planar region;
    directly applying a nucleation layer of oxygen-containing AlN over a large area to the growth surface;
    growing a nitride-based semiconductor layer sequence on the nucleation layer, wherein growing the semiconductor layer sequence comprises selectively growing the semiconductor layer sequence upwards from the planar region such that a growth of the semiconductor layer sequence on the whole surfaces of the three-dimensional surface structures is reduced or non-existent compared to a growth on the planar region; and
    directly applying a nucleation layer of oxygen-containing AlN in such a way that the entire growth surface, the entire planar region and the surface structures are covered by the nucleation layer, wherein an oxygen content of the nucleation layer is more than $10^{19}$ cm$^{-3}$, and wherein a selectivity of the growth of the semiconductor layer sequence on the planar region is targetedly adjusted by the oxygen content of the nucleation layer.

2. The method according to claim 1, wherein the three-dimensional surface structures are substantially covered by the semiconductor layer sequence while growing the semiconductor layer sequence.

3. The method according to claim 1, wherein applying the nucleation layer is ensued by a metal-organic vapor-phase epitaxy.

4. The method according to claim 1, wherein applying the nucleation layer is ensued by sputtering.

5. The method according to claim 1, wherein the three-dimensional surface structures comprise conical or pyramidal elevations on the planar region.

6. The method according to claim 1, wherein the growth substrate comprises aluminum oxide.

7. The method according to claim 6, wherein the planar region is a crystallographic c surface.

8. The method according to claim 1, wherein the semiconductor layer sequence is grown with an optoelectronic active layer, which is provided for emitting or detecting light during operation of the semiconductor chip.

9. The method according to claim 8, wherein the semiconductor chip is designed as a light-emitting or light-detecting diode.

10. An electronic semiconductor chip comprising:
    a growth substrate with a growth surface, which is formed by a planar region having a plurality of three-dimensional surface structures on the planar region;
    a nucleation layer composed of oxygen-containing AlN directly disposed on the growth surface;

a nitride-based semiconductor layer sequence disposed on the nucleation layer, wherein the semiconductor layer sequence is selectively grown from the planar region such that a growth of the semiconductor layer sequence on the whole surfaces of the three-dimensional surface structures is reduced or non-existent compared to a growth on the planar region; and a nucleation layer of oxygen-containing AlN is directly applied in such a way that the entire growth surface, the entire planar region and the surface structures are covered by the nucleation layer, wherein an oxygen content of the nucleation layer is more than $10^{19}$ cm$^{-3}$, and wherein a selectivity of the growth of the semiconductor layer sequence on the planar region is targetedly adjusted by the oxygen content of the nucleation layer.

11. The method according to claim 1, wherein the nucleation layer is applied to the growth surface with a thickness of greater than or equal to 1 nm, and wherein the nucleation layer is applied by sputtering or MOVPE.

12. The method according to claim 1, wherein the nucleation layer is applied to the growth surface with a thickness of greater than or equal to 5 nm.

13. The method according to claim 1, wherein a weight proportion of oxygen in the nucleation layer is greater than or equal to 0.1%.

14. A method for producing an electronic semiconductor chip, the method comprising:

providing a growth substrate comprising a growth surface formed by a planar region having a plurality of three-dimensional surface structures on the planar region;

directly applying a nucleation layer of oxygen-containing AlN over a large area to the growth surface;

growing a nitride-based semiconductor layer sequence on the nucleation layer, wherein growing the semiconductor layer sequence comprises selectively growing the semiconductor layer sequence upwards from the planar region such that a growth of the semiconductor layer sequence on the whole surfaces of the three-dimensional surface structures is reduced or non-existent compared to a growth on the planar region; and directly applying a nucleation layer of oxygen-containing AlN in such a way that the entire growth surface, the entire planar region and the surface structures are covered by the nucleation layer, wherein an oxygen content of the nucleation layer is more than $10^{19}$ cm$^{-3}$, and wherein the oxygen content of the nucleation layer is adjusted in such a way that the semiconductor layer sequence is predominantly grown from the planar region, whereas very little or no growth at all of the semiconductor layer sequence takes place on the three-dimensional surface structures.

* * * * *